United States Patent [19]

Liang

[11] Patent Number: 5,420,758
[45] Date of Patent: May 30, 1995

[54] INTEGRATED CIRCUIT PACKAGE USING A MULTI-LAYER PCB IN A PLASTIC PACKAGE

[75] Inventor: Louis H. Liang, Los Altos, Calif.

[73] Assignee: VLSI Technology, Inc., San Jose, Calif.

[21] Appl. No.: 222,519

[22] Filed: Apr. 4, 1994

Related U.S. Application Data

[63] Continuation of Ser. No. 943,271, Sep. 10, 1992, abandoned.

[51] Int. Cl.⁶ .............................................. H05K 5/02
[52] U.S. Cl. .................................. 361/813; 257/666; 257/668; 257/672; 257/676
[58] Field of Search .............. 257/666, 668, 672, 676, 257/692, 693, 694, 695, 696, 698; 361/321, 813; 228/180.1; 439/876

[56] References Cited

U.S. PATENT DOCUMENTS

| | | | |
|---|---|---|---|
| 4,766,478 | 8/1988 | Dennis | 257/668 |
| 4,782,589 | 11/1988 | Dennis | 257/668 |
| 4,846,700 | 7/1989 | Dennis | 439/68 |
| 4,855,866 | 8/1989 | Imamura et al. | 361/321 |
| 4,870,224 | 9/1989 | Smith et al. | 174/52.4 |
| 4,979,903 | 12/1990 | Gosselin | 439/78 |
| 4,989,069 | 1/1991 | Hawkins | 257/668 |
| 5,136,779 | 8/1992 | Abel et al. | 361/813 |
| 5,227,995 | 7/1993 | Klink et al. | 257/666 |

FOREIGN PATENT DOCUMENTS

| | | | |
|---|---|---|---|
| 61-10263 | 1/1986 | Japan | 257/692 |
| 2-268459 | 11/1990 | Japan | 257/692 |
| 2-291158 | 11/1990 | Japan | 257/692 |
| 3-220761 | 9/1991 | Japan | 257/666 |
| 4-32176 | 2/1992 | Japan | 228/180.1 |

*Primary Examiner*—Leo P. Picard
*Assistant Examiner*—Donald A. Sparks
*Attorney, Agent, or Firm*—Patrick T. King

[57] ABSTRACT

An integrated-circuit package assembly including a lead frame having a number of inwardly extending fingers, the alternate ends of which are formed into an upper row and a lower row to provide a space there between for receipt of the outer edges of a multi-layer printed circuit board (PCB). Vias formed adjacent to the outer edges of the PCB engage with corresponding alternate ends of the inwardly extending fingers when the edges of the multi-layer PCB are inserted in the space provided between the row of fingers in the upper plane and the row of fingers in the lower plane. The ends of the inwardly extending fingers have various lengths which engage via contact pads formed on opposite surfaces of the PCB. A group of the fingers can be pivoted to open the space between the upper and lower row of fingers.

3 Claims, 9 Drawing Sheets

INTEGRATED CIRCUIT PACKAGE USING A MULTI-LAYER PCB IN A PLASTIC PACKAGE

This a continuation of application Ser. No. 07/943,271, filed on Sep. 10, 1992, now abandoned.

BACKGROUND OF THE INVENTION

1. Field of the Invention. This invention relates to packaging techniques for integrated circuits and more particularly to techniques for connecting the leads of a lead frame to a printed circuit substrate on which is mounted an integrated-circuit die.

2. Prior Art, A conventional high-performance plastic quad flat pack (HP PQFP) package for an integrated-circuit uses a substrate, such as a multi-layer printed circuit board (PCB), having multiple connection layers formed thereon. These multiple connection layers are used to provide power, ground, and signal connections to an integrated-circuit die attached to the substrate. The impedance and capacitance of the various connections are controlled with this type of printed-circuit structure so that the electrical performance of an integrated circuit packaged in this manner can be controlled.

In this type of package, the multiple connection layers are fabricated as laminated layers of a multi-layer printed-circuit board (PCB) assembly. The multi-layer printed-circuit board (PCB) is located in the center area of the lead frame, with the leads of the lead frame extending outwardly from the PCB. During a conventional fabrication process, the lead frame is typically formed as an integral part of the multi-layer printed-circuit board assembly so that the area of the lead frame is much greater than the area of the printed-circuit board PCB.

A number of printed-circuit board assemblies, each of which includes a printed-circuit board and an associated, integrally-formed lead frame, are formed in a batch in a large printed circuit board. This is expensive because the area of the large printed circuit board lying beneath the leads of the lead frame is not used. Each of these printed-circuit board assemblies takes up a large area of the large printed circuit board, with much of the area of the large printed circuit board not being used for a multi-layer structure. The printed-circuit board assemblies are typically fabricated in strips of four or five each on the large printed circuit board.

The three major cost components of a conventional high-performance plastic quad flat pack package assembly produced in the above manner are: (1) the number of units created per large PCB; (2) the defect density per strip; and (3) the processing cost for the integrated lead frame. Less than 30% of the usable area of the large PCB is used to manufacture the multi-layer structure. The rest of the area is used only for the lead frame. Over 30% of 4-up lead-frame strips contains at least one defective multi-layer and 50% of 5-up lead-frame strips contains at least one defective multi-layer structure. If a 4-up strip containing a single defective multi-layer structure is scrapped, the yield for that strip is 60–70%. If a 5-up strip containing a single defective multi-layer structure is scrapped, the yield for that strip is 40–50%.

Etching technology is used to manufacture a conventional, integral metal-layer lead frame for a plastic quad flat pack. Etching operations for forming an integral lead frame are much more expensive than conventional stamping operations for forming a separate lead frame.

Conventional plastic quad flat pack package designs include a multi-layer PCB structure with a die cavity. The die, cavity limits both the maximum and the minimum die sizes which can be used with a given multi-layer PCB structure.

U.S. Pat. No. 4,846,700, granted on Jul. 11, 1990, to Richard K. Dennis, discloses a lead frame having rows of leads which are connected to the edges of a semiconductor device. Each of the ends, or heads, of each lead is split in two parts. One part of the split end is called an uppermost leg and the other part is called a lowermost leg. To assemble the leads to the edges of a semiconductor device, the rows of leads are bent away from the horizontal plane of the lead frame to position the spaces between the uppermost legs and the lowermost legs to receive the edges of the semiconductor device. The rows of split leads are then released and the split leads return to the horizontal plane so that the uppermost legs and the lowermost legs of each split lead hold the edges of the semiconductor device. Each split lead thus is attached to an edge of the semiconductor device with both an uppermost leg and a lowermost leg. Each connection thus takes two legs, each of which leg occupies the same amount of horizontal area in the lead frame so that each connection to the semiconductor device takes an area equal to the area of two legs.

U.S. Pat. No. 4,870,224, granted on Sep. 26, 1989, to William D. Smith et al., discloses an integrated-circuit device which is fixed to a ceramic substrate. Conductors are formed on the ceramic substrate and extend from the integrated-circuit device to the edges of the ceramic substrate. The ends of each of the leads of a lead frame are forked to include an upper finger and two lower forked fingers. The substrate is fixed between the three fingers and the fingers are soldered to respective sides of the substrate. The three fingers of each split lead are horizontally spaced apart and occupy the same amount of horizontal space so that each connection to the ceramic substrate takes an area equal to the area of three fingers.

Connection designs which incorporate leads with legs or fingers which contact both sides of a semiconductor device or a substrate, as disclosed in the above referenced patents, use two or three times the amount of area than does a design using a single leg or finger. With the increased need for packages having greater numbers of fine-pitched leads, the use of lead frames with leg or finger designs which use large amounts of area is limited. Consequently, the need exists for an integrated-circuit connection design which has increased lead density while; using minimal area.

SUMMARY OF THE INVENTION

It is therefore an object of the invention to provide an improved design for making connections to a plastic quad flat pack (PQFP) package which incorporates a multi-layer printed circuit board. The design is intended to substantially reduce manufacturing costs by increasing the utilization area of a PCB and the yield of the lead-frame strips. The design also uses a less-expensive stamped lead frame and accommodates a large range of die sizes.

An integrated-circuit package assembly and method of fabricating an integrated-circuit package according to the invention includes having a lead frame with a special configuration for the;inwardly extending ends of the leads. The ends of alternate ones of the inwardly extending fingers are formed to provide a row of ends in an upper plane and a row of ends in a lower plane. A space is provided between the row of fingers in the upper plane and the row of fingers in the lower plane.

An integrated-circuit package assembly according to the invention includes a multi-layer PCB having a number of layers on which are formed conductors. The conductors on the layers are connected using vias. An integrated-circuit die is attached to one surface of the multi-layer PCB. Vias are formed adjacent to the edges of the multi-layer PCB and certain of these vias have corresponding via contact pads formed on opposite surfaces of the multi-layer PCB for engagement with corresponding alternate ends of the inwardly extending fingers of the lead frame when the edge of the multi-layer PCB is inserted in the space provided between the row of fingers in the upper plane and the row of fingers in the lower plane.

The ends of the inwardly extending fingers have various lengths and the via contact pads formed on opposite surfaces of said multi-layer PCB engage with corresponding ends of those fingers. Each of the inwardly extending fingers of the lead frame have portions which are alternately bent upwardly and downwardly so that the ends of the fingers engage opposite sides of the multi-layer PCB. The inwardly extending fingers of the lead frame are connected together by a dam bar to form a unit which is pivotable to thereby expose the space between the row of fingers in the upper plane and the row of fingers in the lower plane to provide for receipt of the edge of the multi-layer PCB.

A method is provided according to the invention for fabricating an integrated-circuit package. The method includes fabricating a number of multi-layer PCB structures on a large multi-layer printed circuit board structure. Each of the multi-layer PCB structures on the larger multi-layer printed circuit board is separated from the others by dicing the larger PCB into smaller multi-layer PCB structures. The individual multi-layer PCB structures are then separately tested and selected. A separate lead frame is fabricated and assembled together with one of the tested multi-layer PCB structures. In a preferred embodiment of the invention, the separate lead frame is fabricated using a stamping operation. The lead frame optionally includes no centrally located die-attach paddle. The multi-layer PCB structures have connections areas formed on their edges to which respective ends of leads which overlap with the multi-layer PCB structure are connected. The inner ends of the leads of the lead frame are alternately attached to one side of the multi-layer PCB structure and then to the other side

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1A:
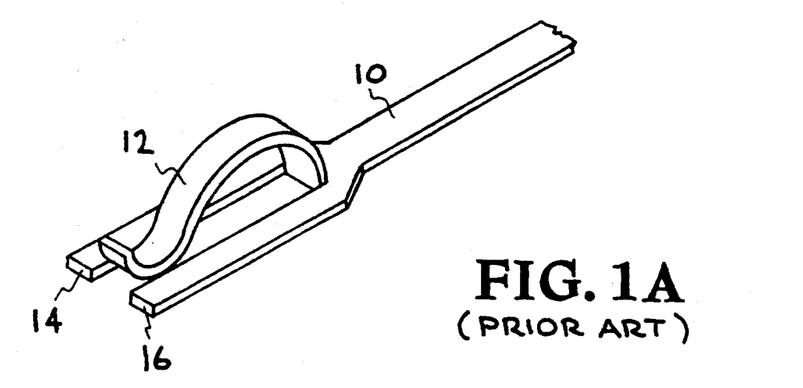
FIG. 1A is an isometric view of a prior art lead having a spring finger at its end.

FIG. 1A shows a design for a prior art lead 10, which is similar to that disclosed in U.S. Pat. No. 4,870,224, granted on Sep. 26, 1989, to William D. Smith et al. The patent discloses an integrated-circuit device which is fixed to a ceramic substrate. The lead 10 has a forked end, which has an upper finger 12 and two lower fingers 14, 16. The upper finger 12 is curved and functions;as a spring. The ends of each of the leads of the lead frame are forked as disclosed in the Figure and include an upper finger and two lower forked fingers.

Figure 1B:
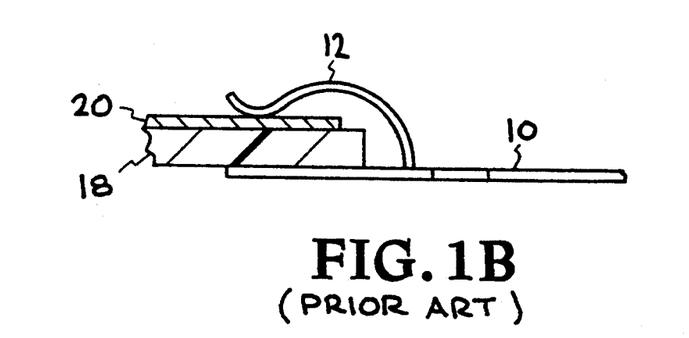
FIG. 1B is an elevation view showing the spring finger of FIG. 1A contacting a conductive trace on an insulating substrate.

FIG. 1B shows an insulated substrate 18 positioned between the upper finger 12 and the two lower fingers 14, 16, with the upper finger pressing against a conductive trace 20 formed on the top surface of the insulated substrate 18. The upper finger 12 is fixed to the substrate by soldering it to the conductive trace 20. The three fingers of each split lead are initially formed from a flat sheet of conductive material and are horizontally spaced apart. This configuration occupies the same amount of horizontal space that the three fingers occupy.

Figure 2A:
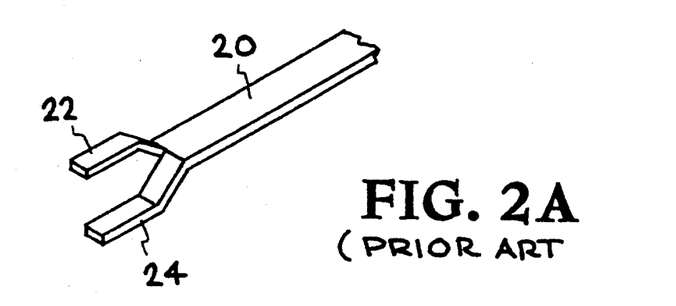
FIG. 2A is an isometric view of a prior art lead having its end, or head, split into an upper leg and a lower leg 24.

FIG. 2A ;shows another design for a prior art lead 20, such as disclosed in U.S. Pat. No. 4,846,700, granted on Jul. 11, 1990, to Richard K. Dennis. The end, or head, of the lead 20 is split into one part which is an upper leg 22 and the other part is called a lower leg 24. A row of split leads is bent away from the horizontal plane of the lead frame and held in position so that a space is opened between the upper and lower legs.

Figure 2B:
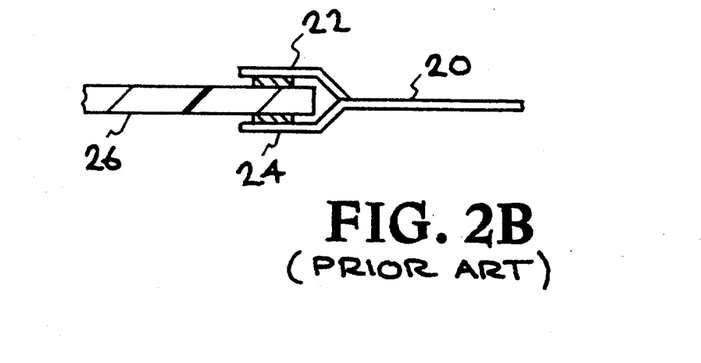
FIG. 2B is an elevation view showing the upper and lower legs of the lead of FIG. 2A contacting the upper and lower surfaces of the edge of a semiconductor device.

FIG. 2B shows that the edges of a semiconductor device 26 are placed in the :opened space between the legs. The rows of split leads are then released and the split leads return to the horizontal plane to hold the edges of the semiconductor device. Each of the split lead thus is attached to an edge of the semiconductor device with both the upper leg 22 and the lower leg 24 contacting opposite sides of the device 26. The two fingers 22, 24 of each split lead 20 are initially formed from a flat sheet of conductive material and are horizontally spaced apart. This configuration occupies the same amount of horizontal area as both of the legs occupy.

Figure 3:
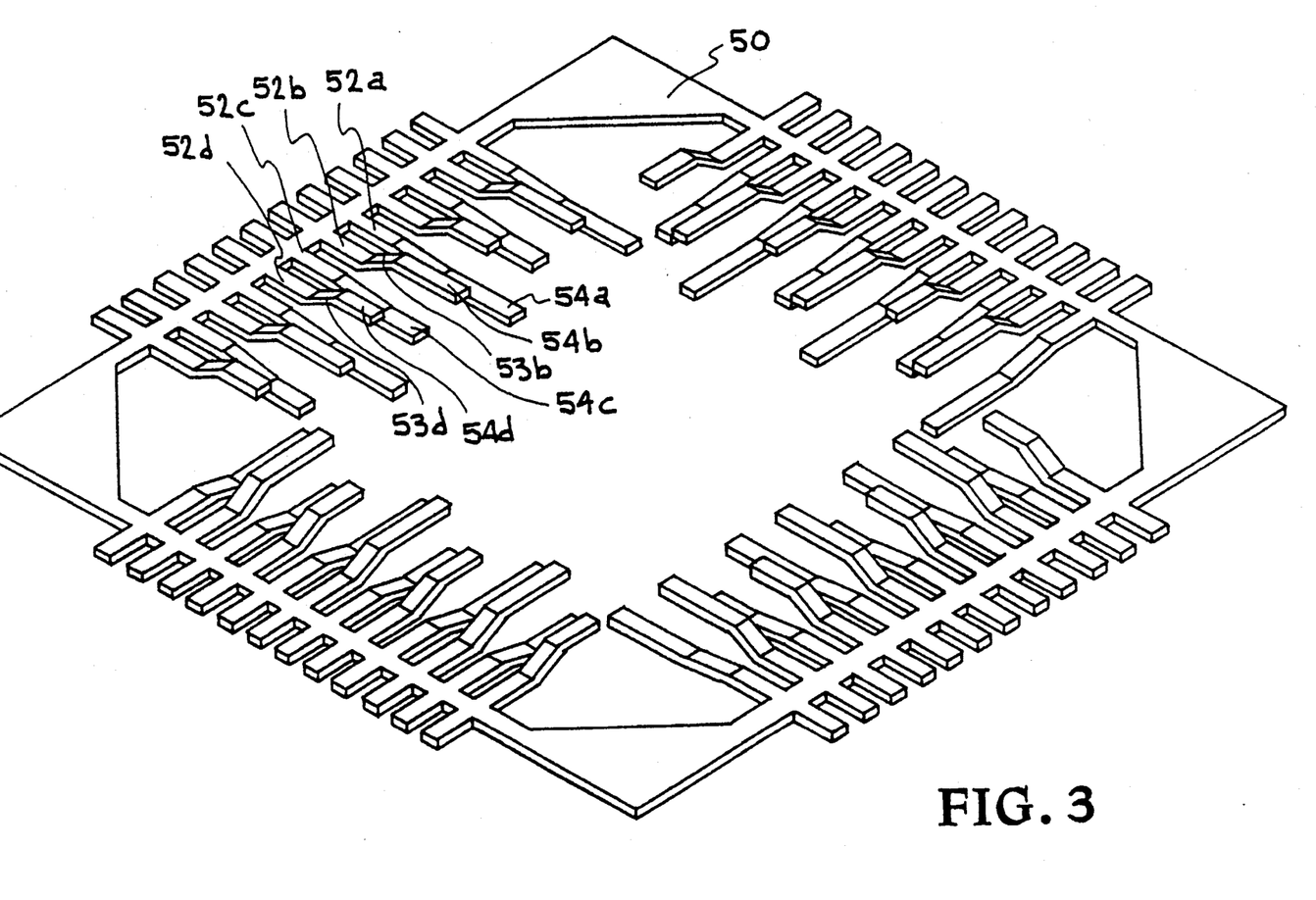
FIG. 3 is an isometric view of a lead frame according to the invention where alternate inner ends of the lead frame are alternately spaced above and below the plane of the lead frame.
Figure 3A:
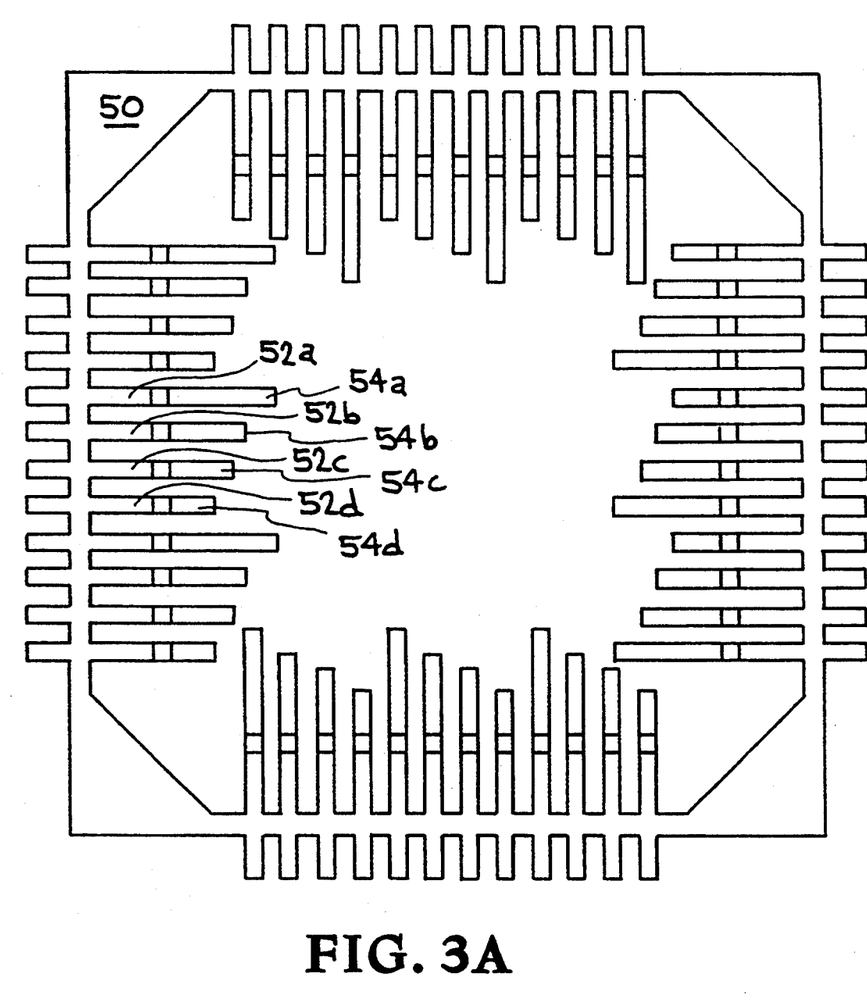
FIG. 3A is a plan view of the lead frame of FIG. 3.

FIGS. 3 and 3A show a design for a separately fabricated lead frame 50, according to the invention. The lead frame 50 is first fabricated, for example, by stamping and is then connected to a multi-layer printed circuit board to be described herein below. Because only the multi-layer printed circuit board itself, rather than a multi-layer PCB with an etched lead frame, is fabricated from a large sheet of multi-layer PCB material, separate fabrication of the lead frame means that a considerable area of the large sheet of multi-layer PCB material is saved. The lead frame 50 has a dam bar 51 and a number of inwardly extending fingers, where a set of fingers is typically shown as 52a, 52b, 52c, 52d. The lead frame and its fingers are initially stamped from a planar sheet of conductive material such as alloy 42. The plane of the lead frame as shown in the Figures is designated as the horizontal plane.

A lead 52b extends from an outer portion of the lead frame, where the outer portion of the lead frame lies in the horizontal plane. The lead 52b has an intermediate portion 53b which extends upwardly at an angle with respect to the horizontal plane. The inner end 54b, or bonding finger, of the lead 52b is fabricated to lie in a horizontal plane which is above and parallel to the plane of the lead frame. Similarly, lead 52d has an intermediate portion 53d which extends upwardly at an angle with respect to the horizontal plane. The inner end 54d of the lead 52d is formed to lie in a horizontal upper plane which is above and parallel to the plane of the lead frame. Observation of the Figures shows that alternate leads have their ends located in the same horizontal plane as the lead 52b. This provide a row of alternate leads having their ends in an upper plane.

Similarly, the ends 54a, 54c of the leads.52a, 52c lie in a row of alternate ends in a lower plane. The row of upper leads and the row of lower leads define a space between the ends of the leads.

Figure 4:
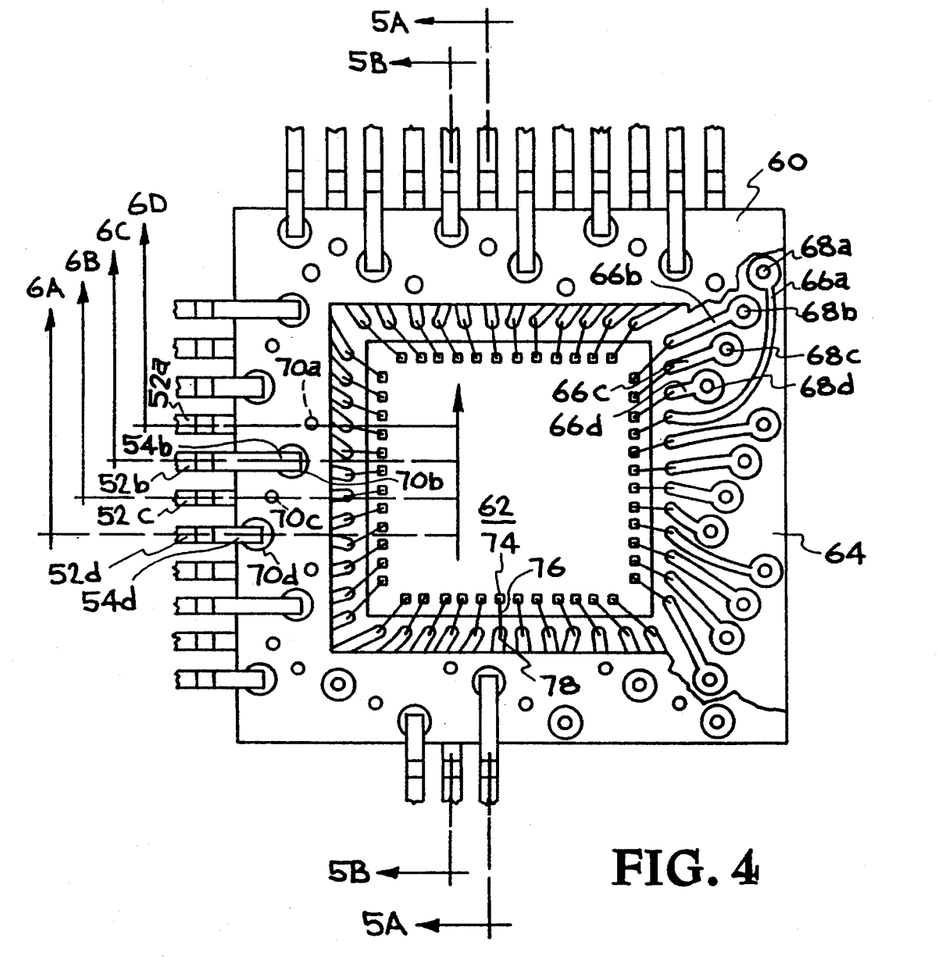
FIG. 4 is a partially cutaway, plan view showing a multi-layer PCB with an integrated-circuit die attached thereto and showing a lead frame with its leads alternately connected to respective via contact pads on the top and bottom of the multi-layer PCB.

FIG. 4 shows an embodiment of the invention in which the inner ends of a lead frame are connected to a multi-layer printed circuit board (PCB) 60. An integrated-circuit die 62 is attached to the multi-layer PCB 60. In this embodiment of the invention, the multi-layer PCB 60 is advantageously formed as a separate item apart from the lead frame, which is separately stamped. The multi-layer CB 60 has a number of layers (typically shown as 64) on which are formed various conductive traces, or conductors,, (typically shown as 66a, 66b, 66c, 66d). Vias or plated-through holes (typically shown as 68a, 68b, 68c, 68d) are formed adjacent to the edges of the multi-layer PCB 60. These and other vias are used to provide connections to various conductors on other layers of the multi-layer PCB 60. Via contact pads (typically shown as 70a, 70b, 70c, 70d) are alternately formed on opposite surfaces of the multi-layer PCB 60. The via contact pads engage with corresponding alternate ends of the inwardly extending fingers of the lead frame.

Having the via contact pads on opposite sides of the multi-layer PCB 60 provides for a greater density of connections to the multi-layer PCB 60. For example, via contact pad 70b on the top side of the multi-layer PCB 60 engages the end 54b of lead 52b when the edge of the multi-layer PCB 60 is inserted in the space provided between the rows of leads in the upper plane and the row of leads in the lower plane. Similarly, via contact pad 70d also on the top side of the multi-layer PCB 60 engages the end 54d of lead 52d. On the bottom side of the multi-layer PCB 60, via contact pad 70a engages the end 54a of lead 52a and via contact pad 70c engages the end 54c of lead 52c. This example illustrates a lead frame having adjacent leads alternately connected to respective via contact pads on the top side and the bottom side of the multi-layer PCB 60. This arrangement minimizes overlapping of the contact points for adjacent leads and permits a higher density of connections.

In this embodiment of the invention, the fingers of the lead frame have various lengths and the via contact pads formed on opposite surfaces of the multi-layer PCB 60 are positioned to engage with corresponding ends of the fingers having various lengths. The via contact pads are sequentially staggered in position in various rows from the edge of the integrated-circuit die 62 in order to accommodate the varying lengths of the leads. The varying lengths of the fingers of the lead frame, the alternating of adjacent fingers on opposite sides of the PCB 60, and the corresponding placement of the via contact pads on opposite surfaces of the PCB 60 in various rows provide space between the contact points for various fingers and their corresponding via contact pads.

FIG. 4 shows a typical die-bonding pad 74 formed on the top surface of the integrated-circuit die 60. The die-bonding pad 76 is connected with a bonding wire 76 to a bonding pad 78 on the inner margin of the PCB 60.

Figure 5A:
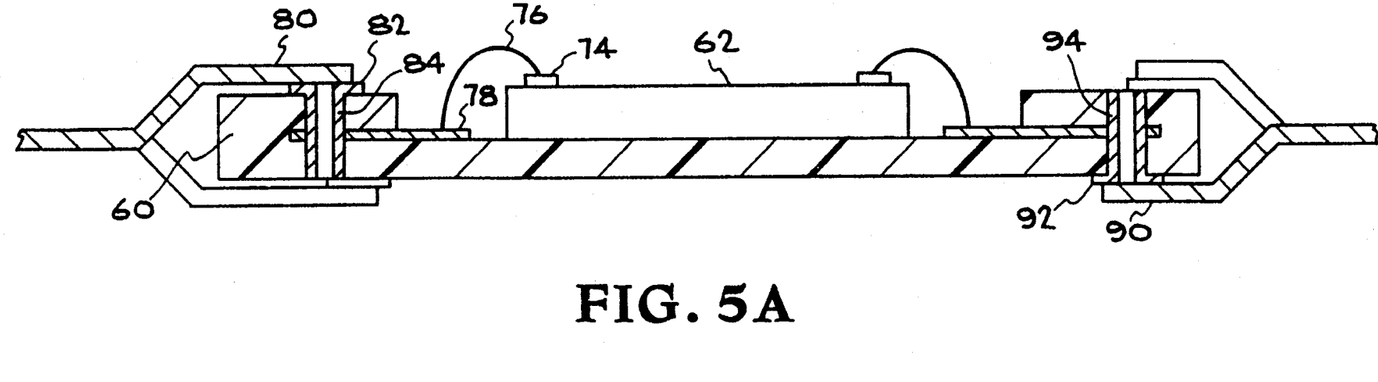
FIG. 5A is a sectional view taken along section line 5A—5A of FIG. 4 illustrating connection of leads of various lengths contacting via contact pads on both sides of a multi-layer PCB.

FIG. 5A illustrates connection of a finger 80 of a longer length to a via contact pad 82 in the second row of via contact pads on the top side of the multi-layer PCB 6,0. The via contact pad 82 is connected to the end of a via formed as a plated-through hole 84 in the multi-layer PCB 60. FIG. 5A also illustrates connection of a finger 90 of a shorter length to a via contact pad 92 in the third row of via contact pads on the top side of the multi-layer PCB 60. The via contact pad 92 is connected to a via formed as a plated-through hole 94 in the multi-layer PCB 60.

Figure 5B:
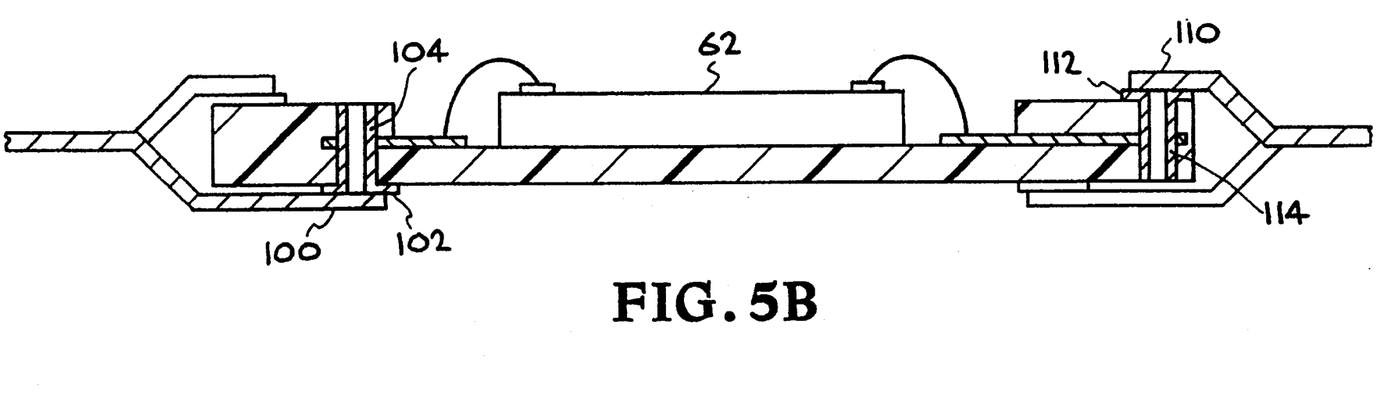
FIG. 5B is a sectional view taken along section line 5B—5B of FIG. 4 illustrating connection of leads of various lengths contacting via contact pads on both sides of a multi-layer PCB.

FIG. 5B shows connection of a finger 100 of a longest length to a via contact pad 102 in the first row of via contact pads on the top side of the multi-layer PCB 60. The via contact pad 102 is connected to the end of a via formed as a plated-through hole 104 in the multi-layer PCB 60. FIG. 5B also shows connection of a finger 110 of a shortest length to the end of a via contact pad 112 in the fourth, or outer, row of via contact pads on the top side of the multi-layer PCB 60. The via contact pad 112 is connected to the end of a via formed as a plated-through hole 114 in the multi-layer PCB 60.

Figure 6A:
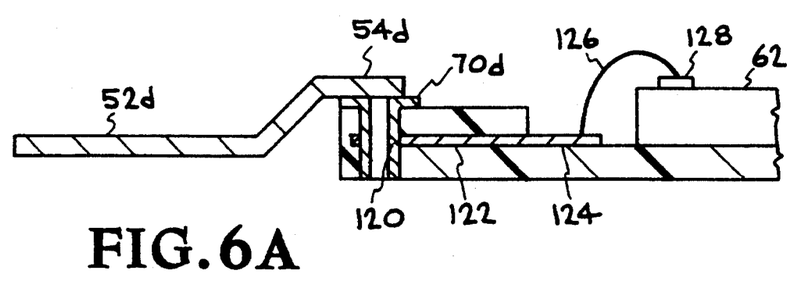
FIG. 6A is a sectional view, taken through section line 6A—6B of FIG. 4, showing a short lead finger in contact with a via contact pad on the top surface of a multi-layer PCB.

FIG. 6A shows the shortest lead finger 52d in contact with the via contact pad 70d on the top surface of the multi-layer PCB 60. The via contact pad 70d is connected to a via 120. The via 120 is connected to a conductive trace 122 which has a bonding pad 124 at its inner end. A bonding wire 126 connects the bonding pad 124 to a bonding pad 128 on the integrated-circuit die 62.

Figure 6B:
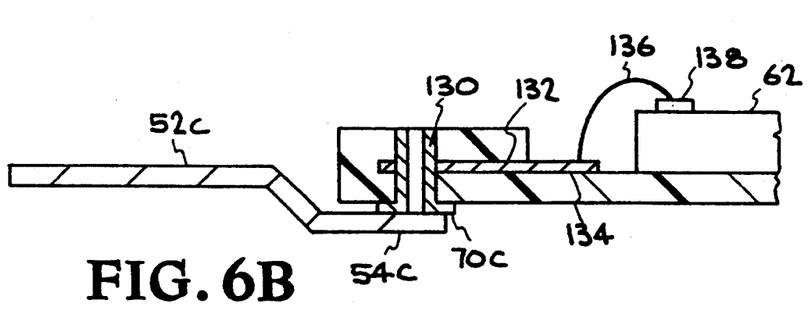
FIG. 6B is a sectional view, taken through section line 6B—6B of FIG. 4, showing an intermediate lead finger in contact with a via contact pad on the bottom surface of a multi-layer PCB.

FIG. 6B shows the shorter lead finger 52c in contact with the via contact pad 70c on the bottom surface of the multi-layer PCB 60. The via contact pad 70c is connected to a via 130. The via 130 is connected to a conductive trace 132 which has a bonding pad 134 at its inner end. A bonding wire 136 connects the bonding pad 134 to a bonding pad 138 on the integrated-circuit die 62.

Figure 6C:
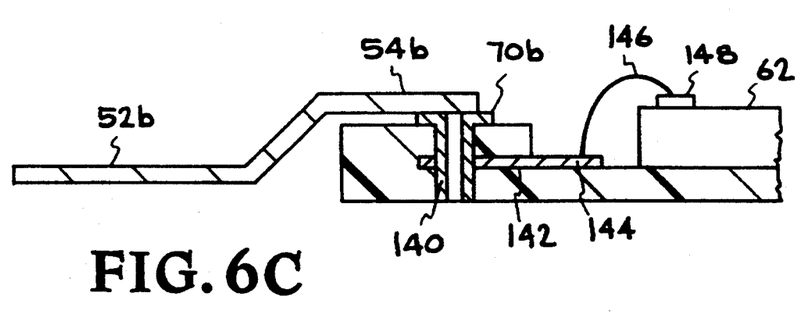
FIG. 6C is a sectional view, taken through section line 6C—6C of FIG. 4, showing an intermediate lead finger in contact with a via contact pad on the top surface of a multi-layer PCB.

FIG. 6C shows the longer lead finger 52b in contact with the via contact pad 70b on the top surface of the multi-layer PCB 60. The via contact pad 70b is connected to a via 140. The via 140 is connected to a conductive trace 142 which has a bonding pad 144 at its inner end. A bonding wire 146 connects the bonding pad 144 to a bonding pad 148 on the integrated-circuit die 62.

Figure 6D:
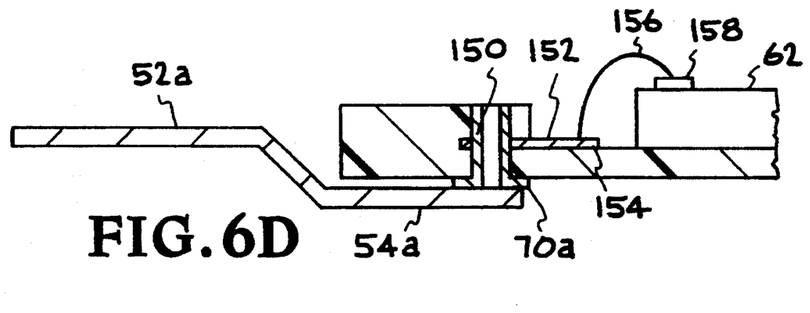
FIG. 6D is a sectional view, taken through section line 6D—6D of FIG. 4, showing a long lead finger in contact with a via contact pad on the bottom surface of a multi-layer PCB.

FIG. 6D shows the longer lead finger 52a in contact with the via contact pad 70a on the bottom surface of the multi-layer PCB 60. The via contact pad 70a is connected to a via 150. The via 150 is connected to a conductive trace 152 which has a bonding pad 154 at its inner end. A bonding wire 156 connects the bonding pad 154 to a bonding pad 158 on the integrated-circuit die 62.

Figure 7A:
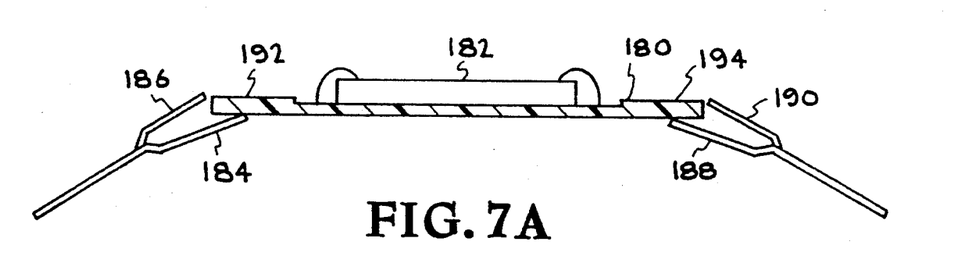
FIG. 7A is a sectional view illustrating a multi-layer PCB being assembled to a lead frame where the leads of the lead frame are oriented downwardly to open the space between the ends of the leads to accept the edges of the multi-layer PCB.

FIG. 7A illustrates a multi-layer PCB 180 with an integrated-circuit die 182 attached thereto, similar to the arrangement of FIG. 4. The multi-layer PCB 180 is shown in the first stage of being assembled to a lead frame where two pairs of adjacent leads (typically shown as 184,186 and 188,190) are illustrated as being oriented to .have their inner ends positioned upwardly, as illustrated. This tends to open the space between the upper ends of the leads to accept the respective outer edges 192, 194 of the multilayer PCB 180. With reference to FIGS. 3 and 3A, the two pairs of adjacent leads can be oriented upwardly by rotating the leads around an axis extending roughly through the dam bar 51 for the lead frame. Such a techniques is disclosed in the Dennis U.S. Pat. No. 4, 846, 700.

Figure 7B:
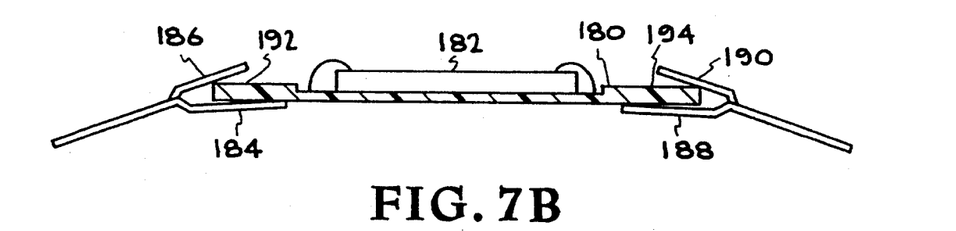
FIG. 7B is a sectional view illustrating a multi-layer PCB being assembled to a lead frame where the leads of the lead frame are oriented more horizontally to further accept the edges of the multi-layer PCB.

FIG. 7B illustrates the multi-layer PCB 180 in its next stage of assembly to the lead frame, where the pairs of typical leads 184,186 and 188,190 are oriented more horizontally so that the respective outer edges 192, 194 of the multi-layer PCB 180 are further accepted within the space between the upper and the lower leads of the lead frame.

Figure 7C:
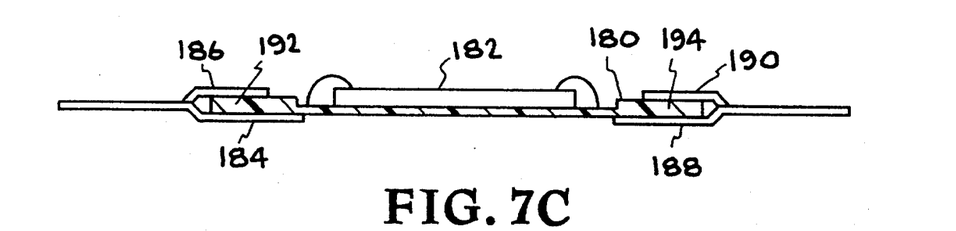
FIG. 7C is a sectional view illustrating a multi-layer PCB being assembled to a lead frame where the leads of the lead frame are oriented horizontally to hold the edges of the multi-layer PCB.

FIG. 7C illustrates the multi-layer PCB 180 in its last stage of assembly to the lead frame, where the pairs of typical leads 184, 186 and 188, 190 are oriented horizontally so that the respective outer edges 192, 194 of the multi-layer PCB 180 are fully accepted within the space between the upper and the lower leads of the lead frame.

Figure 8:
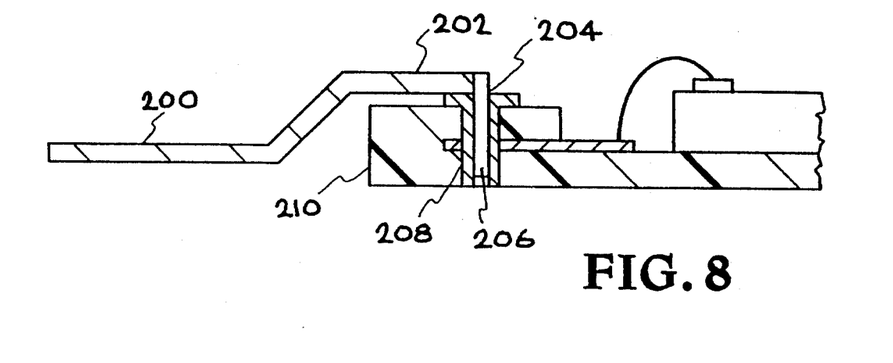
FIG. 8 is a sectional view of a lead having an inner end with a downwardly projecting portion which is designed to be inserted into the center bore of a via.

FIG. 8 illustrates an alternative embodiment of an end of a typical lead 200. The inner end 202 has a downwardly projecting portion 204 which is designed to be inserted into the center bore 206 of a via 208 formed in a multi-layer PCB 210. The downwardly projecting portion 204 can have a number of different configurations such as suggested in U.S. Pat. No. 4,979,903 granted to J. P. Gosssselin on Dec. 25, 1990.

Figure 9:
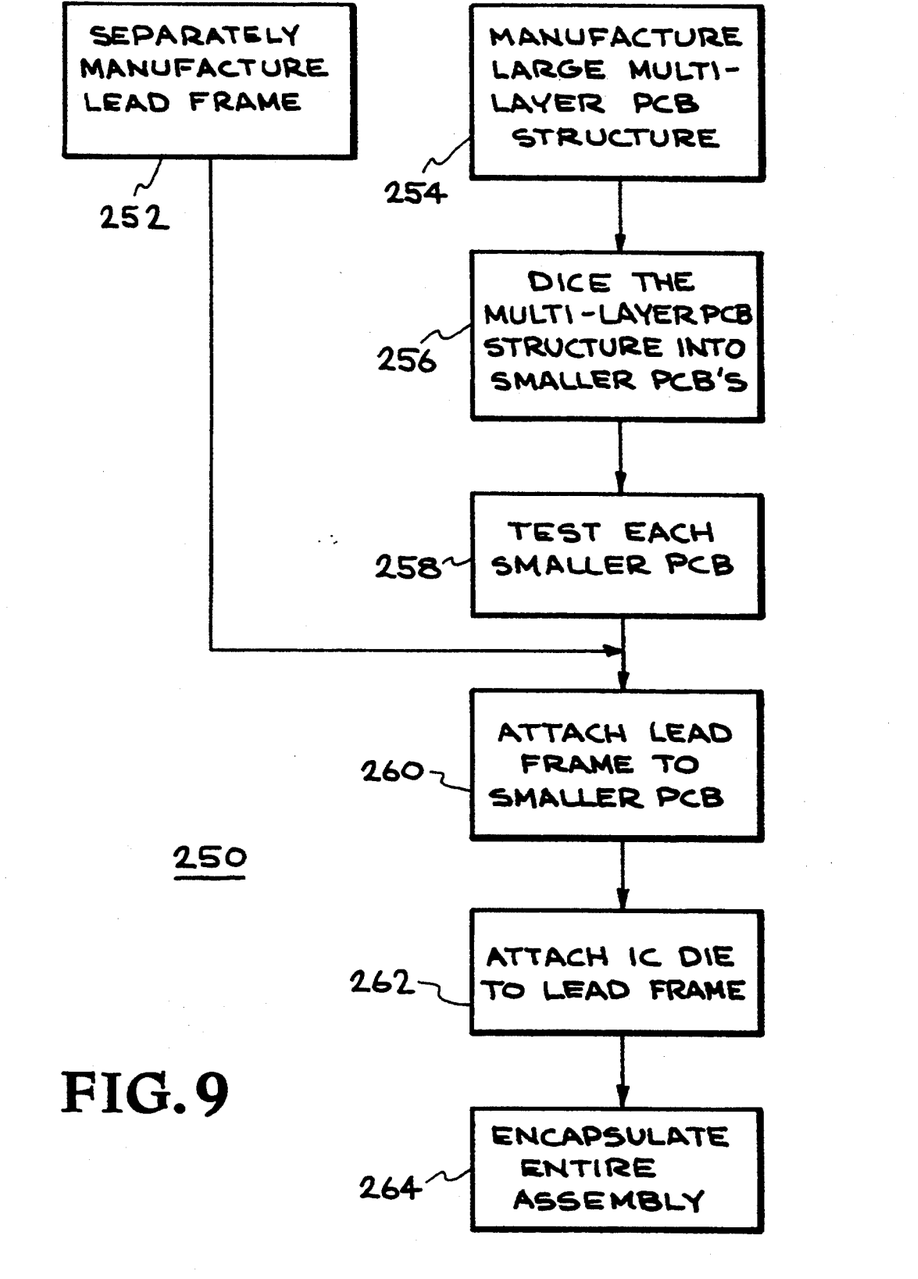
FIG. 9 is a flow chart illustrating various process steps in fabricating an integrated-circuit package according to the invention.

FIG. 9 shows a flow chart 250 illustrating various process steps used in fabricating an integrated-circuit package according to the invention. In this process, a multi-layer printed circuit board structure and a lead frame are manufactured separately instead of as a single integrated unit, saving a considerable amount of area of a large sheet of multi-layer PCB material.

Step 252 shows that the lead frame is manufactured as a separate item. A separate single-layer lead frame is fabricated by a stamping operation. Unlike a conventional lead frame, the lead frame used in this invention has no die-attach paddle portion for mounting an integrated-circuit die. Instead, the inner leads of the separate single-layer lead frame are designed to overlap connections areas on the edges of the multi-layer PCB structure after the multi-layer PCB structure and the separate single-layer lead frame are assembled together.

Step 254 shows that a large multi-layer printed circuit board structure is manufactured to provide only the multi-layer PCB elements of a package. A number of multi-layer PCB structures are batch formed as part of a large sheet of multi-layer printed circuit board. This eliminates wasting areas of the multi-layer printed circuit board which would underlie a lead frame. The multi-layer PCB structure is also designed to have very short conductors, or leads, so that utilization of the PCB area is maximized.

Step 256 shows that each of the individual multi-layer PCB structures (called smaller PCBs) is diced, or cut, from the larger sheet of multi-layer printed circuit board.

Step 258 shows that these individual PCB structures are then separately tested. Only those PCB structures which are tested and found to be good are used in subsequent assembly steps.

Step 260 shows that a tested multi-layer PCB structure and a single-layer lead frame are assembled together using techniques such as, for example, resistance welding, brazing, solder reflow, or other techniques.

Step 262 shows that an integrated-circuit die is fixed to the multi-layer structure using, for example, an electrically non-conductive adhesive material. Appropriate connections are made between the integrated-circuit die and the package using, for example, automated wire bonding techniques. Elimination of a die-attach cavity in the multi-layer PCB structure results in more usable surface area in the multi-layer PCB structure being available for power/ground conductors. This additional area can be used to reduce the total number of layers required in a multi-layer PCB structure.

Steps 262 and 260 can be interchanged if, desired, to first attach the integrated-circuit die to the multi-layer structure, prior to attaching the lead frame to the multi-layer PCB structure Step 264 shows that the entire assembly of the lead frame, the multi-layer PCB structure, and the attached integrated-circuit die are then encapsulated in molded plastic material.

Using the technique as described, a completed lead frame according to the invention has much greater yield than a conventional integral lead frame and multi-layer PCB package configuration integrally formed from a large sheet of multi-layer PCB material.

The multi-layer PCB structure as initially fabricated has no leads extending from it. In order to make electrical connections between the multi-layer PCB structure and the lead frame, several different methods are used. In the method illustrated in FIG. 8, an array of via holes are created in the multi-layer PCB structure near the edges of the structure. The inner ends of the leads are shaped so that they can be inserted into respective ones of the via holes in the multi-layer PCB structure and then reflow soldered.

In another method illustrated in FIG. 3 through 6D, wire bonding sites or pads for making connections to vias in the multi-layer structure are formed on the top and bottom surfaces of the multi-layer PCB structure, near the edges of the multi-layer PCB structure. The inner ends of the leads of the lead frame are attached to the wire bonding sites or pads using techniques such as welding and solder reflow. For extremely high density lead counts with a fine pitch, the inner leads of the lead frame are formed to alternately attach to one side of the multi-layer PCB structure and then to the other side of the multi-layer PCB structure, as shown in connection with FIGS. 3 through 6D above. The attachment pads for the vias of the multi-layer PCB structure are located alternately with conductive pads and non-conductive pads on both sides of the multi-layer structure to match the alternatively formed inner leads of the lead frame.

In yet another method, wire bonding sites or pads are also formed on the outside layers of a multi-layer PCB structure, near the edges of the multi-layer PCB structure. These wire bonding sites or pads are connected to vias formed in the multi-layer PCB structure. The multi-layer PCB structure is then bonded to a die-attach paddle of a conventional lead frame using an adhesive material. Electrical connection is made with another bonding wire between the multi-layer PCB structure and the inner leads of the lead frame.

If a flexible multi-layer PCB rather than a conventional rigid multi-layer PCB is used to manufacture a multi-layer PCB structure, electrical connections can be made using the methods described immediately above.

Figure 10A:
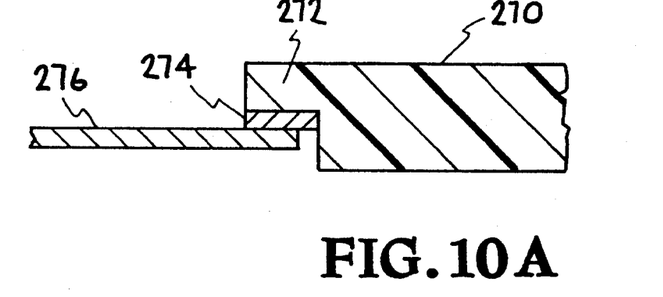
FIGS. 10A and 10B are sectional views of adjacent leads in a multi-layer PCB used in a thin-profile packages where metallized horizontal steps, or outwardly projecting flange areas, are formed along the edges of the multi-layer FCB for connection of the ends of the leads of a lead frame.
Figure 10B:
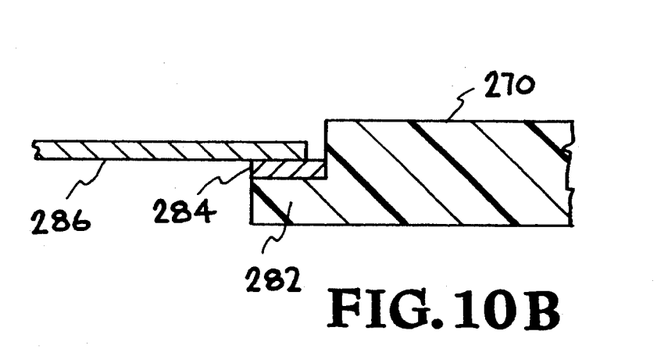

FIGS. 10A and 10B shows in simplified form adjacent sections of a multi-layer PCB 270, which is advantageously used, for example, in a thin-profile package for an integrated circuit. In certain applications, such as for thin-profile packages, it is desirable to have the edges of the multi-layer PCB be made thinner. FIG. 10A shows a horizontal step 272 formed in an outwardly projecting flange area of the multi-layer PCB 270. The horizontal surface of the step 272 has a metal area 274 formed thereupon. The end of a lead 276 of a lead frame is connected by welding, soldering, or the like, to the metal layer 274 as indicated in the FIG. FIG. 10B shows another horizontal step 282 formed in the outwardly projecting flange area of the multi-layer PCB 270. The horizontal surface of the step 282 also has a metal area 284 formed thereupon so that the end of a lead 286 of the lead frame is connected thereto by welding, soldering, or the like, as indicated in the FIG. The metallized areas 274, 284 are formed such that alternate leads of the lead frame contact metallized areas on alternate sides of the flanges.

Figure 11A:
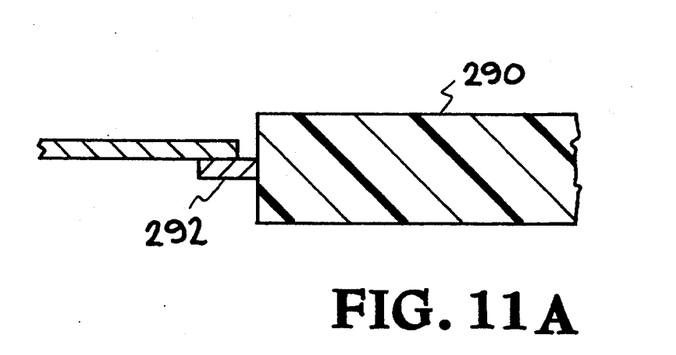
FIGS. 11A and 11B are sectional views of adjacent leads in a multi-layer PCB used in a thin-profile packages where very short stub leads project horizontally from the edges of the multi-layer PCB structure for connection of the ends of the leads of a lead frame.
Figure 11B:
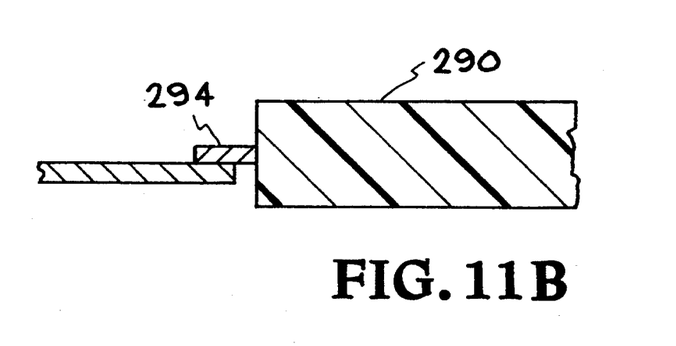

FIGS. 11A and 11B show adjacent sections of a multi-layer PCB 290, used in a thin-profile package. In this version of a thin-profile package, very short stub leads 292, 294 project horizontally from the peripheral edges of the multi-layer PCB structure 290. The respective ends of the leads 296, 298 of a lead frame are welded or soldered directly to these stub leads 292, 294, as indicated in the FIGS.

The packaging variation illustrated in FIGS. 10A, 10B, 11A, and 11B permit the area of the multi-layer PCB itself to be enlarged somewhat because the peripheral or marginal areas of the multi-layer PCB are not used for vias and connection points for the leads.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the Claims appended hereto and their equivalents.

I claim:

1. An integrated-circuit package assembly, comprising:
   a lead frame having an array of inwardly extending fingers, wherein the end of each inwardly extending finger has a only single contact area and wherein the ends of adjacent inwardly extending fingers are alternately formed to provide a row of fingers in an upper plane and a row of fingers in a lower plane, wherein a space is provided between the end of each inwardly extending finger disposed in said row of fingers in the upper plane and the row of fingers in the lower plane, said end of each of the inwardly extending fingers have a various length, and a multi-layer PCB having a number of layers on which are formed conductors, said conductors on said layers are connected using vias, wherein said multi-layer PCB has certain vias formed adjacent to the edges thereof, and
wherein said certain vias have corresponding via contact areas formed on opposite surfaces of said multi-layer PCB for respective engagement with corresponding single contact areas on the ends of the inwardly extending fingers of the lead frame when an edge of the multi-layer PCB is inserted in the space provided between the row of fingers in the upper plane and the row of fingers in the lower plane, said multi-layer PCB having one surface on which is attached one or more integrated-circuit dies, said multi-layer PCB having single contact areas formed on opposite sides of said multi-layer PCB engaged with the single contact area on corresponding alternate ends of the inwardly extending fingers having various lengths of the lead frame when the edge of the multi-layer PCB is inserted into the space provided between the end of each inwardly extending finger disposed in said row of fingers of various lengths in the upper plane and the row of fingers of various lengths in the lower plane.

2. An integrated-circuit package assembly, comprising:
a lead frame having an array of inwardly extending fingers, wherein the end of each inwardly extending finger has a only single contact area and wherein the ends of adjacent inwardly extending fingers are alternately formed to provide a row of fingers in an upper plane and a row of fingers in a lower plane, wherein a space is provided between the end of each inwardly extending finger disposed in said row of fingers in the upper plane and the row of fingers in the lower plane; and
a multi-layer PCB having a number of layers on which are formed conductors, said multi-layer PCB having one surface on which is attached one or more integrated-circuit dies, said multi-layer PCB having single contact areas formed on opposite sides of said multi-layer PCB engaged with the single contact area on corresponding alternate ends of the inwardly extending fingers of the lead frame when the edge of the multi-layer PCB is inserted into the space provided between the end of each inwardly extending finger disposed in said row of fingers in the upper plane and the row of fingers in the lower plane, said contact pads formed on opposite surfaces of said multi-layer PCB are staggered in position.

3. A lead frame for an integrated circuit, comprising a plurality of inwardly extending fingers, each having a single end containing a single contact area thereon, wherein the ends of adjacent inwardly extending fingers are alternately formed to provide a row of ends in an upper plane and a row of ends in a lower plane, so that a space is provided between the row of fingers in the upper plane and the row of fingers in the lower plane to accept an edge of a printed circuit board (PCB), said row of ends in said upper plane coupled to contacts areas disposed on a first surface of said PCB and said row of ends in said lower plane coupled to contact areas disposed on a second surface of said PCB, said PCB disposed between said upper and lower plane of said fingers, said single end of each of the inwardly extending fingers having a various length to engage a corresponding single contact area formed on said PCB.

* * * * *